(12) United States Patent
Huang et al.

(10) Patent No.: US 12,613,281 B2
(45) Date of Patent: Apr. 28, 2026

(54) FAILURE DETECTION METHOD AND FAILURE DETECTION SYSTEM FOR BATTERY RACKS

(71) Applicant: DELTA ELECTRONICS, INC., Taoyuan City (TW)

(72) Inventors: Wen-Fong Huang, Taoyuan City (TW); Jyun-Kai Chen, Taoyuan City (TW); Shih-Hung Liu, Taoyuan City (TW); Ya-Chen Chen, Taoyuan City (TW)

(73) Assignee: DELTA ELECTRONICS, INC., Taoyuan City (TW)

( * ) Notice: Subject to any disclaimer, the term of this patent is extended or adjusted under 35 U.S.C. 154(b) by 177 days.

(21) Appl. No.: 18/735,954

(22) Filed: Jun. 6, 2024

(65) Prior Publication Data
US 2025/0216466 A1     Jul. 3, 2025

(30) Foreign Application Priority Data
Dec. 29, 2023     (CN) .......................... 202311841506.0

(51) Int. Cl.
  *G01R 31/3835*     (2019.01)
  *G01K 1/024*     (2021.01)
  (Continued)

(52) U.S. Cl.
  CPC ......... *G01R 31/3835* (2019.01); *G01K 1/024* (2013.01); *G01K 3/005* (2013.01);
  (Continued)

(58) Field of Classification Search
  CPC .......... G01K 3/005; G01K 1/024; G01K 3/08; G01R 31/392; G01R 31/3835; G01R 31/396; H01M 10/486; H01M 10/482
  See application file for complete search history.

(56) References Cited

U.S. PATENT DOCUMENTS 9,882,400 B2     1/2018 Dai et al.
11,621,573 B2 *   4/2023 Wang ...................... H02J 7/005
                                                    320/134
(Continued)

FOREIGN PATENT DOCUMENTS

CN     111551858 A     8/2020
CN     112924875 A     6/2021
(Continued)

OTHER PUBLICATIONS

Search Report dated Feb. 10, 2025 of the corresponding European patent application 24180067.1.
(Continued)

*Primary Examiner* — Eman A Alkafawi
*Assistant Examiner* — Suresh K Rajaputra
(74) *Attorney, Agent, or Firm* — MUNCY, GEISSLER, OLDS & LOWE, P.C.

(57) ABSTRACT

A failure detection method for battery racks is disclosed and includes: continuously computing a voltage difference data in a computation frequency; computing a standard deviation by using the voltage difference data retrieved from each battery rack up to present; obtaining a first voltage trend and a second voltage trend according to the voltage difference data in a first period and the voltage difference data in a second period when the standard deviation is greater than a preliminary-filtered threshold; computing an intersection of the first voltage trend and the second voltage trend to obtain a voltage trend status; computing a voltage slope according to the voltage difference data of the second period; and generating an alarm message when the voltage trend status is abnormal and the voltage slope is greater than a slope threshold, where the alarm message indicates the position of a battery cell occurring overvoltage status.

18 Claims, 6 Drawing Sheets

(51) Int. Cl.
    *G01K 3/00*       (2006.01)
    *G01K 3/08*       (2006.01)
    *G01R 31/396*    (2019.01)
    *H01M 10/48*     (2006.01)
(52) U.S. Cl.
    CPC ............. *G01K 3/08* (2013.01); *G01R 31/396*
        (2019.01); *H01M 10/482* (2013.01); *H01M*
                        *10/486* (2013.01)

(56)         References Cited

U.S. PATENT DOCUMENTS

| | | |
|---|---|---|
| 2019/0036178 A1 | 1/2019 | Karner et al. |
| 2022/0140617 A1 | 5/2022 | Wang et al. |
| 2023/0152388 A1* | 5/2023 | Sung ........................ B60L 58/21 |
| | | 701/33.6 |
| 2023/0258725 A1 | 8/2023 | Lim |

FOREIGN PATENT DOCUMENTS

| | | |
|---|---|---|
| CN | 113219361 A | 8/2021 |
| CN | 115356642 A | 11/2022 |
| CN | 115407216 A | 11/2022 |
| CN | 116106756 A | 5/2023 |
| CN | 116879788 A | 10/2023 |
| JP | 6138216 B2 | 5/2017 |
| TW | 201925813 A | 7/2019 |

OTHER PUBLICATIONS

Office Action dated Jul. 29, 2024 of the corresponding Taiwan patent application.

* cited by examiner

FAILURE DETECTION METHOD AND FAILURE DETECTION SYSTEM FOR BATTERY RACKS

BACKGROUND OF THE DISCLOSURE

Technical Field

The disclosure generally relates to a detection method and detection system for battery racks, and more particularly to a failure detection method and a failure detection system for battery racks.

Description of Related Art

During the operation of charging or discharging, batteries may experience a decline in performance due to overvoltage or overheating conditions. In some cases, battery malfunctions caused by overvoltage or overheating can lead to the disablement of the device.

Existing monitoring mechanisms for battery operation primarily focus on monitoring state characteristics such as voltage, current, or temperature to assess whether any abnormal conditions occurred. However, existing methods have some shortcomings: relying on a single state characteristic for abnormality judgment may result in misjudgments due to the inability to consider other state characteristics of the battery.

On the other hand, temperature characteristics of the battery are also used as part of the factors for evaluating the battery's condition, such as the maximum or minimum temperature. Actually, the battery exhibits corresponding states based on operations or idle conditions of the device. For example, the battery temperature decreases when the device is in an idle state. Therefore, evaluating the battery health simply based on temperature increase or decrease may lead to erroneous detection results due to the lack of consideration for the device operation.

SUMMARY OF THE DISCLOSURE

One of the exemplary embodiments is to provide a failure detection method for battery racks, performed by a failure detection system for battery racks including a voltage data retrieving module and a micro-controller, wherein the battery racks include multiple battery modules. The failure detection method includes steps of: (a) sensing a voltage data of battery cells of the multiple battery modules by the voltage data retrieving module, and continuously computing a voltage difference data of the voltage data in a computation frequency by the micro-controller; (b) using the voltage difference data of the battery racks up to present to compute a standard deviation by the micro-controller; (c) when determining that the standard deviation is greater than a preliminary threshold, respectively obtaining a first voltage trend according to the voltage difference data of a first period and a second voltage trend according to the voltage difference data of a second period, wherein the second period is greater than the first period; (d) computing, by the micro-controller, an intersection of the first voltage trend and the second voltage trend to obtain a voltage trend state; (e) computing, by the micro-controller, a voltage slope according to the voltage difference data of the second period; and (f) when determining that the voltage trend state is at a potentially abnormal state and the voltage slope is greater than a slope threshold, generating an alarm message by the micro-controller, wherein the alarm message indicates that a position of the battery cells being at an overvoltage state corresponding to the voltage difference data when the standard deviation is greater than the preliminary threshold.

One of the exemplary embodiments is to provide a failure detection method for battery racks, performed by a battery racks failure detection system including a temperature data retrieving module and a micro-controller. The battery racks include multiple battery modules. The failure detection method includes steps of: (a) sensing a temperature data of the battery racks by the temperature data retrieving module, and using the temperature data, by the micro-controller, to compute a temperature slope, a maximum temperature and a minimum temperature of multiple temperature feature data; (b) continuously computing, by the micro-controller, a temperature difference data of the temperature data in a computation frequency, and using the temperature difference data to compute a $Z$ score; (c) setting, by the micro-controller, a first discrete score to the temperature slope, a second discrete score to the maximum temperature, a third discrete score to the minimum temperature, and a fourth discrete score to the $Z$ score; (d) adding up, by the micro-controller, the first discrete score, the second discrete score, the third discrete score, and the fourth discrete score to obtain a grading value; and (e) evaluating, by the micro-controller, whether the battery racks are at an abnormal state according to the grading value, and generating an alarm message when evaluating that the battery racks are at the abnormal state, wherein the alarm message indicates that a position of the maximum temperature or the minimum temperature represents the battery racks being abnormal.

DETAILED DESCRIPTION

Figure 1:
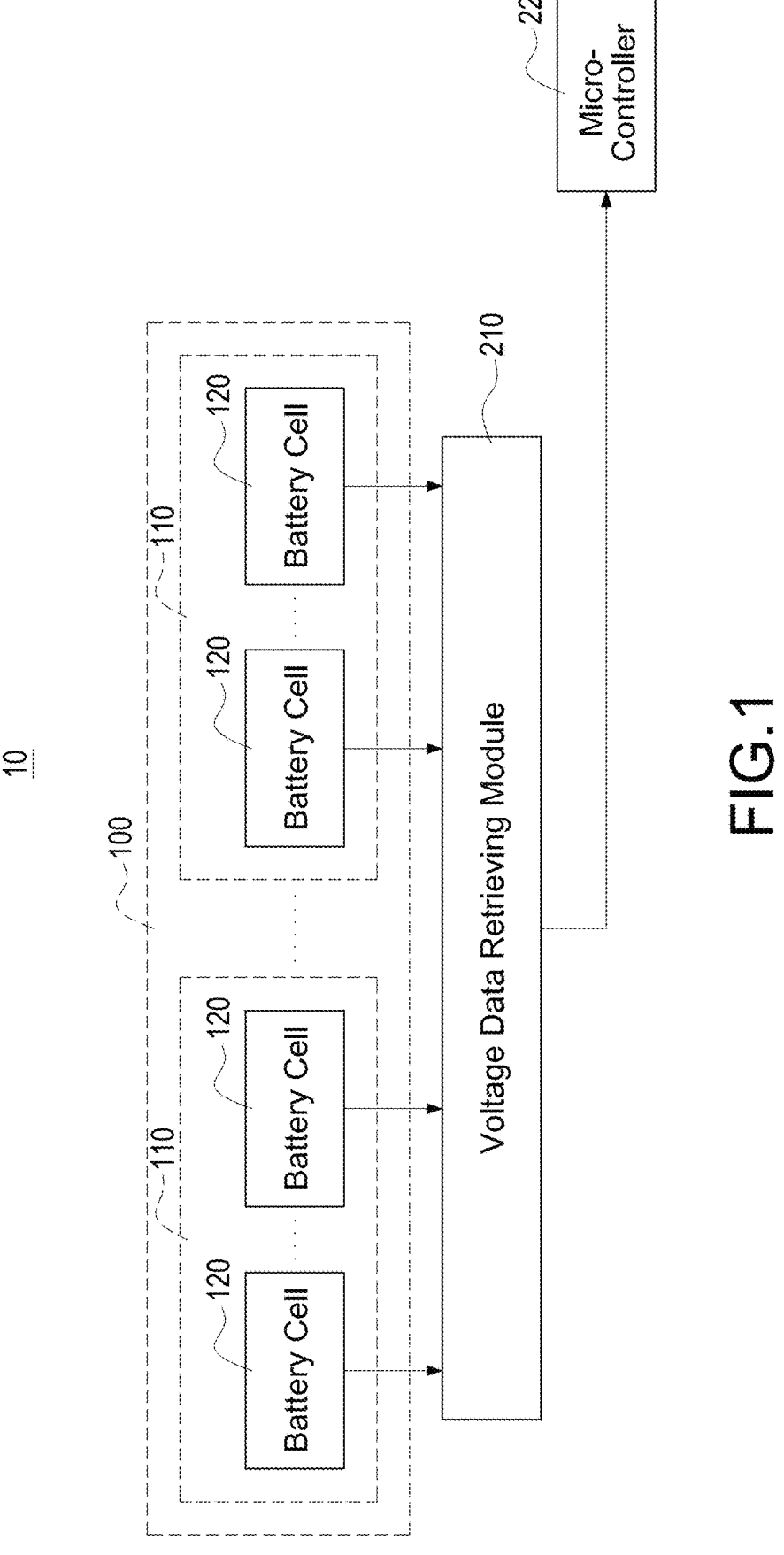
FIG. 1 is a block diagram illustrating a failure detection system for battery racks by detecting voltage to monitor anomaly states of the battery racks in accordance with an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

The failure detection system and failure detection method for battery racks are provided to monitor a short-term and a long-term voltage variation trend of the battery racks. The short-term and long-term variation trends having two different periods are referred, and an intersection of the trends is applied to double check the rise and decline states of the voltage variation. Furthermore, the retrieved voltage data is used for a regression computation, and the slope of the voltage variation in each corresponding time section is computed. Therefore, the voltage variation trend and the slope of the voltage variation are synthetically judged to determine whether any possible precursor of overvoltage in the battery racks may occur, so the condition that the overvoltage problem will occur may be known in advance.

The failure detection system and failure detection method for battery racks also monitor temperature variations of the battery racks. Specifically, the time window is adopted to be one data group to compute a high temperature variation trend and low temperature variation trend of the battery racks, and the maximum temperature and the minimum temperature per time unit (every minute) are also considered. Based on the analyzed data above, the disclosure provides a diagnosis of any portent of abnormality, so as to predominate the abnormalities of the battery racks in advance.

FIG. 1 is a block diagram illustrating a failure detection system for battery racks by detecting voltage to monitor anomaly states of the battery racks in accordance with an embodiment of the present disclosure.

In the embodiment, as shown in FIG. 1, the battery rack 100 includes multiple battery modules 110, and each battery module 110 includes multiple battery cells 120.

The battery racks failure detection system 10 includes a voltage data retrieving module 210 and a micro-controller 220. The voltage data retrieving module 210 is coupled to the micro-controller 220.

The voltage data retrieving module 210 is configured to sense voltage data of each battery cell 120 of each battery module 110. The battery racks failure detection system 10 includes a storage medium (not shown in figures) configured to store the voltage data sensed from each battery cell 200. The voltage data is, for example, a time-voltage curve. Because the voltage data retrieving module 210 may identify each battery cell 120, all positions of the battery cells 120 occurring abnormal condition may be traced when the micro-controller 220 detects the abnormalities of the voltage.

Figure 2:
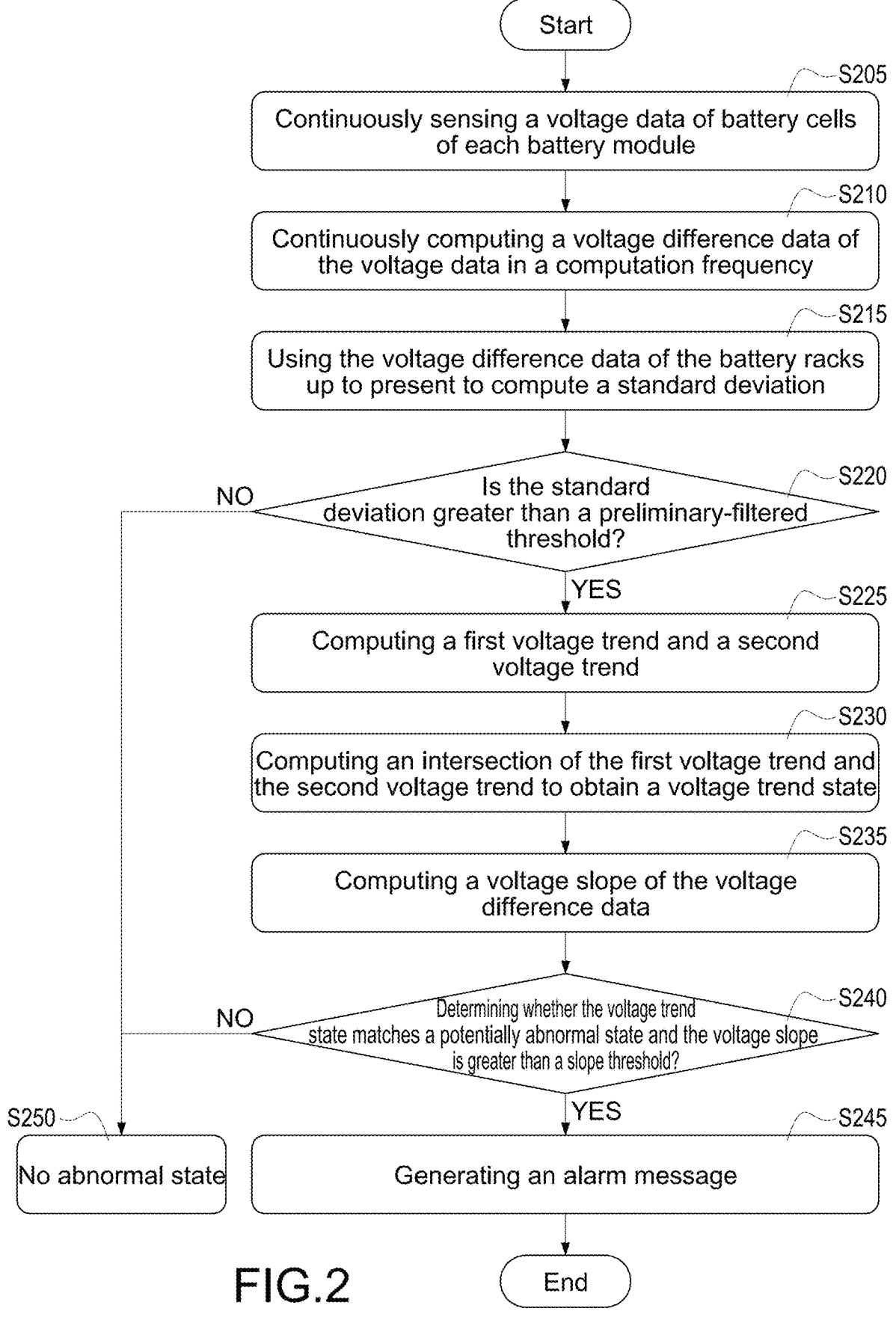
FIG. 2 is a flowchart illustrating a failure detection method for battery racks by detection voltage in accordance with an embodiment of the present disclosure.

FIG. 2 is a flowchart illustrating a failure detection method for battery racks by detection voltage in accordance with an embodiment of the present disclosure. The description is provided incorporating FIG. 1 and FIG. 2.

In step S205, the voltage data retrieving module 210 continuously senses the voltage data of each battery cell 120 of every battery module 110.

In step S210, the micro-controller 220 continuously computes a voltage difference data of each battery cell 120 in a computation frequency according to the voltage data of each battery cell 120. To clarify the description, the voltage difference data of one battery cell 120 is provided as one example, and the micro-controller 220 performs the same detection process to every battery cell 120 of the battery racks 100.

In step S215, the micro-controller 220 uses the voltage difference data up to present of the battery racks 100 to compute a standard deviation σ.

In step S220, the micro-controller 220 determines whether the standard deviation is greater than a preliminary threshold. If the standard deviation is greater than the preliminary threshold, it represents that the variation of the voltage difference data up to present is enormous, so the micro-controller 220 preliminarily determines the possibility of the battery racks 100 causing the voltage abnormality and performs step S225. If the standard deviation is equal to or less than the preliminary threshold, the micro-controller 220 performs step S250 and determines that the battery racks 100 are not at the abnormal state.

In step S225, the micro-controller 220 obtains a first voltage trend according to the voltage difference data of each first period and obtains a second voltage trend according to the voltage difference data of each second period.

In step S230, the micro-controller 220 computes an intersection of the first voltage trend and the second voltage trend to obtain a voltage trend state.

In step S235, the micro-controller 220 uses the voltage difference data of the second period to compute a voltage slope.

In step S240, the micro-controller 220 determines whether the voltage trend state matches a potentially abnormal state and the voltage slope is greater than a slope threshold. If the determinations are YES, the micro-controller 220 performs step S245. If one of the determinations is NO, the micro-controller 220 performs step S250 and decides that there is no abnormal state.

In step S245, the micro-controller 220 generates an alarm message. Because the alarm message carries information on the positions of the battery cells that the voltage difference data is greater than the preliminary threshold, the user may get the information on which battery cells encounter the overvoltage by the alarm message.

Detailed descriptions of all steps are provided below.

In step S205, the voltage data retrieving module 210 continuously retrieves the voltage data of each battery cell 120 of the battery racks 100, and the micro-controller 220 performs a data pre-processing process to the voltage data, such as imputing missing values.

In step S210, the micro-controller 220 continuously computes the voltage difference data between two voltage data adjacent in time in a computation frequency. In one embodiment, because the voltage data retrieving module 210 continuously retrieves the voltage data of each battery cell 120 of the battery racks 100, and the micro-controller 220 computes the voltage difference data $\Delta V$ between two adjacent voltage data every minute. Because the voltage data retrieving module 210 keeps retrieving the voltage data, the voltage difference data $\Delta V$ are generated continuously in step S210.

In step S215, the micro-controller 220 computes the standard deviation a of all the voltage difference data $\Delta V$ in step S210. In the embodiment, the standard deviation a is updated in each minute.

In one embodiment, the voltage data retrieving module 210 continuously retrieves voltage data of every battery cell 120 of the battery racks 100. The micro-controller 220 computes the voltage difference data of two voltage data adjacent in time in the computation frequency (such as every minute) based on the voltage data of every battery cell 120, and takes all the voltage difference data generated in real-time as the samples having continuity in time to compute the standard deviation 6.

In step S220, the micro-controller 220 compares the standard deviation a with the preliminary threshold to preliminarily evaluate the abnormal state of the battery racks 100. For example, when the standard deviation a is greater than the preliminary threshold, the micro-controller 220 preliminarily evaluates that the battery racks 100 are at a potentially abnormal state but does not send any alarm message. The micro-controller 220 further observes the actual condition of abnormalities in a long-term voltage trend and a short-term voltage trend.

In step S225, the micro-controller 220 computes the first voltage trend (also called the 'short-term voltage trend') according to the voltage difference data $\Delta V$ of each first period. In one example, the first period is 2 hours. The micro-controller 220 computes the difference (first trend data) between the voltage difference data $\Delta V$ of the current time and the time 2 hours before the current time with the frequency of a minute. For example, the micro-controller 220 computes the differences: the voltage difference data $\Delta V$ at 10 a.m. is reduced by the voltage difference data $\Delta V$ at 8 a.m., the voltage difference data $\Delta V$ at 10:01 a.m. is reduced by the voltage difference data $\Delta V$ at 8:01 a.m., and so on. Following the rules above, the micro-controller 220 takes all the difference values of the first period as the multiple first trend data, and the multiple first trend data forms the first voltage trend.

The first trend data is illustrated as the formula: $\Delta V_{Last\ round\ difference} = \Delta V_{current} - \Delta V^{Last\ round}$, where $\Delta V_{current}$ is the voltage difference data of the time of the current period, $\Delta V_{Last\ round}$ is the voltage difference data of the time of the previous period, and $\Delta V_{Last\ round\ difference}$ is the difference of the voltage difference data.

Similarly, the micro-controller 220 computes the second voltage trend (also called the 'long-term trend') according to the voltage difference data $\Delta V$ of every second period. In one example, the second period is 24 hours (1 day). The micro-controller 220 computes the difference between the voltage difference data $\Delta V$ of the current time and the time 24 hours before the current time with the frequency of a day (data interval). For example, the micro-controller 220 computes the differences: the voltage difference data $\Delta V$ at 8 a.m. 2 February is reduced by the voltage difference data $\Delta V$ at 8 a.m. 1 February, the voltage difference data $\Delta V$ at 8:01 a.m. 2 February is reduced by the voltage difference data $\Delta V$ at 8:01 a.m. 1 February, and so on. Following the rules above, the micro-controller 220 takes all the difference values of the second period as the multiple second trend data, and the multiple second trend data forms the second voltage trend.

The second trend data is illustrated as the function: $\Delta V_{Last\ day\ difference} = \Delta V_{current} - \Delta V_{Last\ day}$, where $\Delta V_{current}$ is the voltage difference data of the time of the current period, $\Delta V_{Last\ day}$ is the voltage difference data of the time of the previous period, and, $\Delta V_{Last\ day\ difference}$ is the difference of the voltage difference data.

In one embodiment, the interval of the second period is longer than the interval of the first period.

In one embodiment, the ratio of the interval of the first period to the interval of the second period is 1:X, where the variable X is any positive integer that is equal to or greater than 12.

In step S230, the micro-controller 220 computes an intersection of the first voltage trend and the second voltage trend in every default section to obtain the voltage trend state. In one embodiment, the micro-controller 220 computes a first quantity, which represents the number of the multiple first trend data that is greater than Y times the standard deviation every default section. Also, the micro-controller 220 computes a second quantity, which represents the number of the multiple first trend data that is less than or equal to Y times the standard deviation in every default section. The micro-controller 220 then evaluates the first voltage trend according to the first quantity and the second quantity. The variable Y is a positive integer that is equal to or greater than 1 (such as 3). To clarify the description, 1 time the standard deviation is taken as one example to be compared with the first trend data.

In one example, the default section is 2 hours and the computation frequency is 1 minute. During every 2 hours, 1 first trend data is generated every minute, so 120 first trend data are generated every 2 hours. The micro-controller 220 respectively compares the 120 first trend data of the default section with the standard deviation, collects the first trend data that are greater than the standard deviation to obtain the first quantity (such as 58 first trend data), and collects the first trend data that are less than or equal to the standard deviation to obtain the second quantity (such as 62 first trend data). Then, the micro-controller 220 compares the first quantity with the second quantity. When the first quantity is greater than the second quantity, it represents that the voltage variation trend taking the first period as a basis is at a dispersing state, and the micro-controller 220 may further confirm that the voltage is at an abnormal state and determine that the first voltage trend is at a positive trend. When the first quantity is less than or equal to the second quantity, it represents that the voltage variation trend taking the first period as a basis is at a centered and stable state, and the micro-controller 220 may further confirm that the voltage is at a normal state and determine that the first voltage trend is at a stable trend.

Similarly, the micro-controller 220 computes a third quantity, which presents the number of the multiple second trend data that is greater than Y times the standard deviation in every default section. Also, the micro-controller 220 computes a fourth quantity, which presents the number of the multiple second trend data that is less than or equal to Y times the standard deviation in every default section. The micro-controller 220 then evaluates the second voltage trend according to the third quantity and the fourth quantity. The variable Y is a positive integer that is equal to or greater than 1 (such as 3). To clarify the description, 1 time the standard deviation is taken as one example to be compared with the second trend data.

In one example, the default section is 2 hours and the computation frequency is 1 minute. During every 2 hours, 1 second trend data is generated every minute, so 120 second trend data are generated every 2 hours. The micro-controller 220 respectively compares the 120 second trend data with the standard deviation, collects the second trend data that are greater than the standard deviation to obtain the third quantity (such as 21 second trend data), and collects the second trend data that are less than or equal to the standard deviation to obtain the fourth quantity (such as 99 second trend data). Then, the micro-controller 220 compares the third quantity with the fourth quantity. When the third quantity is greater than the fourth quantity, it represents that the voltage variation trend taking the second period as a basis is at a dispersing state, and the micro-controller 220 may further confirm that the voltage is at an abnormal state and determine that the second voltage trend is at the positive trend. When the third quantity is less than or equal to the fourth quantity, it represents that the voltage variation trend taking the second period as a basis is at a centered and stable state, and the micro-controller 220 may further confirm that the voltage is at a normal state and determine that the second voltage trend is at a stable trend.

In one embodiment, the standard deviation may be computed based on all the voltage difference data of all the battery cells (in this case, the trend data of every battery cell is compared with the same standard deviation). Or, the standard deviation may be computed based on all the voltage difference data of the battery cell its own, so every cell has one corresponding standard deviation, and the corresponding standard deviation is compared with the trend data owned by every battery cell.

Referred back to step S230, the micro-controller 220 respectively computes the intersection of the first voltage trend and the second voltage trend in every default section to obtain the voltage trend state. In one embodiment, the micro-controller 220 computes the intersection of the first voltage trend (classified as the short-term trend) and the second voltage trend (classified as the long-term trend) to obtain the evaluation data in each default section by comprehensively considering the voltage variation trends of different periods. In one embodiment, when the first voltage trend is the positive trend and the second voltage trend is the positive trend, the intersection of the two voltage trends indicates the positive trend. Therefore, the micro-controller 220 obtains a final result about the voltage trend in the default section, i.e., the positive trend (indicating the potentially abnormal state). In another embodiment, when one of the first voltage trend and the second voltage trend is the stable trend, the micro-controller 220 obtains a final result about the voltage trend in the default section, i.e., the stable trend. The micro-controller 220 computes the intersection of the first voltage trend and the second voltage trend of each default section. Therefore, the micro-controller 220 obtains the voltage trend state (such as the state of the positive trend or the stable trend) of each default section (such as every 2 hours). For example, the micro-controller 220 may make the evaluation result every 2 hours that the voltage trend state is the positive trend or the stable trend.

The micro-controller 220 obtains distribution data of multiple time and voltage difference data of each battery cell 120 in step S210. In one embodiment, the micro-controller 220 computes a polynomial regression function that fits the actual distribution data of the time and the voltage difference data the most and uses the polynomial regression function to compute the voltage slope of the voltage difference data of each second period. For example, the micro-controller 220 finds the most fitting polynomial regression function $Y=ax^2+bx+c$, where a, b, and c are constant values, x is time, and Y is the voltage difference data. Then, the micro-controller 220 computes the voltage slope by the difference between the voltage difference data of 2 adjacent hours and the difference between the time (i.e., 2 hours).

The voltage slope may be illustrated as the function: Slope rate=$(\Delta V_{Last}-\Delta V_{First})\Delta T_{End}-\Delta T_{Start})$, where $\Delta V_{First}$ and $\Delta T_{Start}$ are the voltage difference data and the time of the starting point of the second period, and $\Delta V_{Last}$ and $\Delta T_{End}$ are the voltage difference data and the time of the endpoint of the second period.

In step S240, when determining that the voltage trend state is the positive trend (matching the potentially abnormal state) and the voltage slope is greater than the slope threshold, the micro-controller 220 confirms the abnormal state and generates the alarm message (step S245). Otherwise, the micro-controller 220 confirms that there is no abnormal state (step S250).

In one embodiment, the alarm message indicates the position of the battery cells corresponding to the voltage difference data that the standard deviation is greater than the preliminary threshold.

Figure 3:
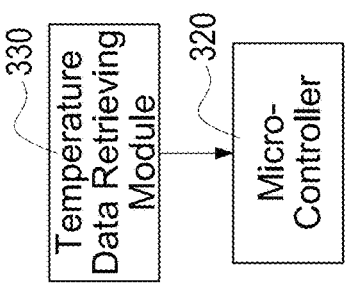
FIG. 3 is a block diagram illustrating a failure detection system for battery racks by detecting temperature to monitor anomaly states of the battery racks in accordance with an embodiment of the present disclosure.
Figure 3:
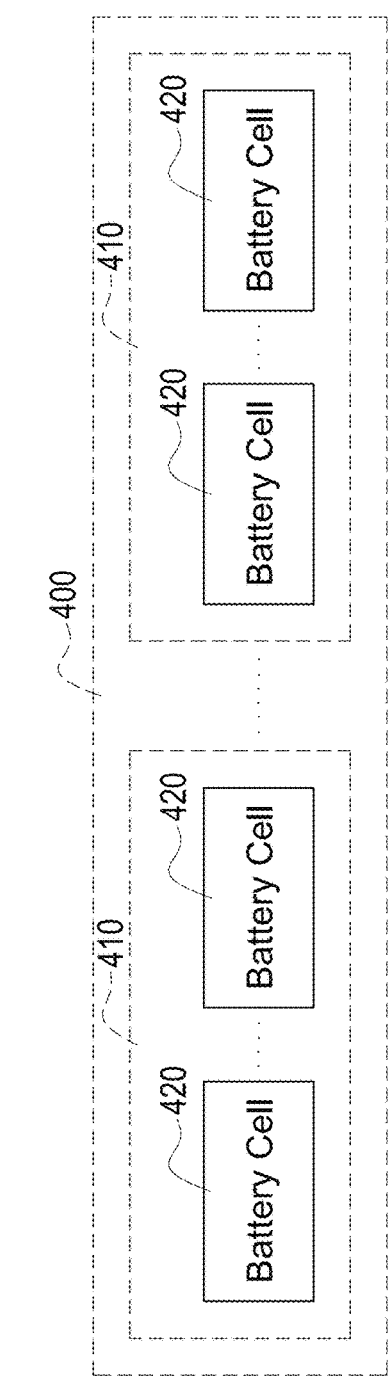

FIG. 3 is a block diagram illustrating a failure detection system for battery racks by detecting temperature to monitor anomaly states of the battery racks in accordance with an embodiment of the present disclosure.

In the embodiment, as shown in FIG. 3, the battery racks 400 includes multiple battery modules 410, and every battery module 410 includes multiple battery cells 420. In the embodiment, the battery racks failure detection system 20 is configured to detect the temperature of the battery racks 400 and to determine whether the battery racks 400 are at the abnormal state.

The battery racks failure detection system 20 includes a temperature data retrieving module 330 and a micro-controller 320. The temperature data retrieving module 330 is coupled to the micro-controller 320.

In one embodiment, the temperature data retrieving module 330 is disposed at one battery rack 400 and configured to sense the temperature data of which battery rack 400 it is disposed.

The battery racks failure detection system 20 includes a storage medium (not shown in the figures) and is configured to store the temperature data of the detected battery racks 400. The temperature data is the time-temperature curve, for example. Because the temperature data retrieving module 330 may identify the position of the battery rack 400, the position of an abnormal battery rack from the battery racks 400 may be traced when the micro-controller 320 detects that the temperature condition is abnormal.

Figure 4:
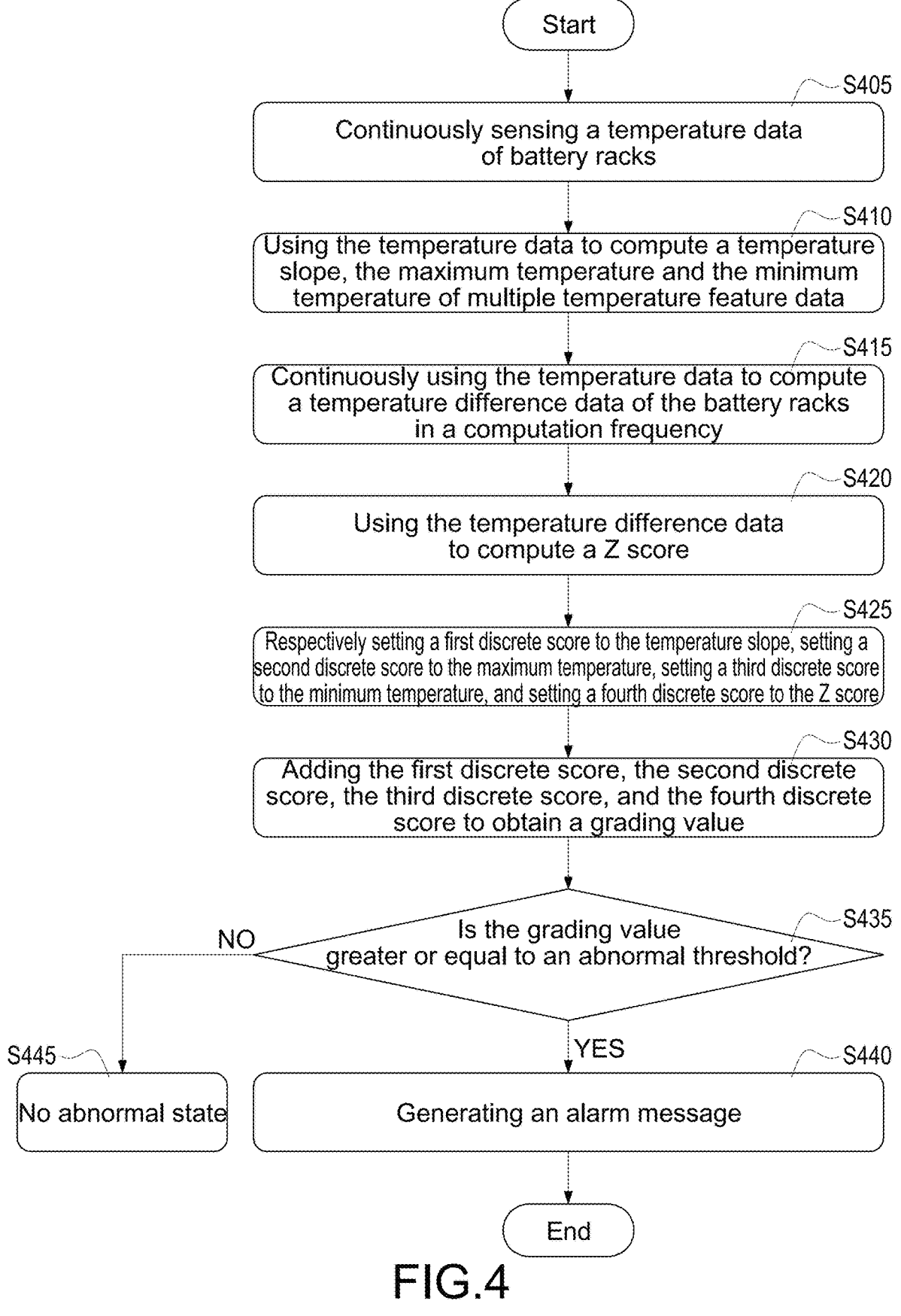
FIG. 4 is a flowchart illustrating a failure detection method for battery racks by detecting temperature in accordance with an embodiment of the present disclosure.

FIG. 4 is a flowchart illustrating a failure detection method for battery racks by detecting temperature in accordance with an embodiment of the present disclosure. The description is provided incorporating FIG. 3 and FIG. 4.

In step S405, the temperature data retrieving module 330 continuously senses the temperature data of the battery racks 400.

In step S410, the micro-controller 320 uses the temperature data to compute a temperature slope, a maximum temperature, and a minimum temperature of the multiple temperature feature data.

In step S415, the micro-controller 320 continuously uses the temperature data to compute temperature difference data of the battery racks 400 in a computation frequency.

In step S420, the micro-controller 320 uses the temperature difference data to compute a Z score of the battery racks 400.

In step S425, the micro-controller 320 respectively sets a first discrete score (level) to the temperature slope, sets a second discrete score to the maximum temperature, sets a third discrete score to the minimum temperature, and sets a fourth discrete score to the Z score.

In step S430, the micro-controller 320 adds up the first discrete score, the second discrete score, the third discrete score, and the fourth discrete score to obtain a grading value of the battery racks 400.

In step S435, the micro-controller 320 determines whether the grading value is greater than an abnormal threshold. If the grading value is greater than the abnormal threshold, the micro-controller 320 performs step S440. If the grading value is less than or equal to the abnormal threshold, the micro-controller 320 performs step S445, confirms that there is no abnormal state, and keeps monitoring process.

In step S440, the micro-controller 320 generates an alarm message. Because the alarm message indicates the position of the maximum temperature or the minimum temperature of the temperature feature data, it represents the position of the battery rack 400 which is abnormal, and the user may get the information on which battery rack 400 is abnormal by the alarm message.

Detailed descriptions of all steps are provided below.

In one embodiment, the micro-controller 320 takes all the temperature data of the battery racks 400 as one computation group to compute the temperature slope of the temperature data, gets the maximum temperature and the minimum temperature, computes the temperature difference data, and uses the temperature difference data to compute the Z score of each battery rack 400.

In step S405, the temperature data retrieving module 330 continuously senses the temperature data, these temperature data represent the temperature of the battery rack 400 where the temperature data retrieving module 330 is disposed. The micro-controller 320 performs the data pre-processing process on the temperature data, such as imputing missing values.

In step S410, the micro-controller 320 uses the temperature data to compute the temperature slope of the temperature data of the battery racks 400. In one embodiment, the temperature data is the time-temperature curve.

In one embodiment, the temperature slope includes a maximum temperature slope and a minimum temperature slope. The micro-controller 320 retrieves a piece of the temperature data by one time window and obtains the maximum temperature and the minimum temperature of the temperature data. The micro-controller 320 slides the time window to retrieve multiple maximum window temperature values $T_{max}$ and multiple minimum window temperature values $T_{min}$ each corresponding to one time window. To clarify the description, the maximum window temperature value of the ith time window is represented by $T_{max(i)}$, and the minimum window temperature value is represented by $T_{min(i)}$. The micro-controller 320 uses two maximum window temperature values $T_{max(i+1)}$ and $T_{max(i)}$ of two adjacent time windows to compute the maximum temperature slope, and uses the two minimum window temperature values $T_{min(i+1)}$ and $T_{min(i)}$ of two adjacent time windows to compute the minimum temperature slope.

In one embodiment, the adjacent time windows may overlap in time domain. For example, the length of the time window is 8 minutes, and two adjacent time windows overlap in 4 minutes. If 8:00 is the starting point, the range of a first time window is from 8:00 to 8:07, and the range of a second time window is from 8:04 to 8:11. The micro-controller 320 respectively gets the maximum window temperature value $T_{max(1)}$ and the minimum window temperature value $T_{min(1)}$ of the first time window (from 8:00 to 8:07) and the maximum window temperature value $T_{max(2)}$ and the minimum window temperature value $T_{min(2)}$ of the second time window (from 8:04 to 8:11). It should be noted that the overlapping length between two time windows is not limited herein. Two time windows overlap with each other in half of the time window length is taken as one example for the following description.

In one embodiment, the micro-controller 320 computes the maximum temperature slope according to the maximum window temperature values of two adjacent time windows. The maximum temperature slope is illustrated as the function:

$$S_{max(i)} = \frac{T_{max(i+k-1)} - T_{max(i)}}{k},$$

where k is the length of one time window (in minutes). For example, the micro-controller 320 retrieves the maximum window temperature value $T_{max(1)}$ of the time interval from 8:00 to 8:07 and the maximum window temperature value $T_{max(2)}$ of the time interval from 8:04 to 8:11, computes the difference $T_{max(2)} - T_{max(1)}$ between the maximum window temperature values of two adjacent time windows, and divides the difference $T_{max(2)} - T_{max(1)}$ by the length (e.g., 8 minutes) of the time window to obtain a quotient to be the maximum temperature slope of one corresponding time window, which is illustrated as the function:

$$S_{max(1)} = \frac{T_{max(8)} - T_{max(1)}}{8}.$$

Similarly, the micro-controller 320 computes the minimum temperature slope according to the minimum window temperature values of two adjacent time windows. The minimum temperature slope is illustrated as the function:

$$S_{min(i)} = \frac{T_{min(i+k-1)} - T_{min(i)}}{k},$$

where k is the length of one time window (in minutes). For example, the micro-controller 320 retrieves the minimum window temperature value $T_{min(1)}$ of the time interval from 8:00 to 8:07 and the minimum window temperature value $T_{min(2)}$ of the time interval from 8:04 to 8:11, computes the difference $T_{min(2)} - T_{min(1)}$ between the minimum window temperature values of the two adjacent time windows, and divides the difference $T_{min(2)} - T_{min(1)}$ by the length (e.g., 8 minutes) of the time window to obtain a quotient to be the minimum temperature slope of one corresponding time window, which is illustrated as the function:

$$S_{min(1)} = \frac{T_{min(8)} - T_{min(1)}}{8}.$$

In step S410, the micro-controller 320 obtains the maximum temperature and the minimum temperature per minute from the multiple temperature feature data. For example, the micro-controller 320 records the maximum temperature maxT and the minimum temperature minT in 1 minute from 8:00:00 to 8:00:59. Based on the similar process of continuous monitoring and computation, the micro-controller 320 obtains multiple maximum temperatures maxT and multiple minimum temperatures minT.

In step S415, the micro-controller 320 continuously computes the temperature difference data between two adjacent time intervals in the computation frequency. In one embodiment, the micro-controller 320 computes the temperature difference data $\Delta T$ between two temperature data that are spaced apart from 1 minute. For example, micro-controller 320 subtracts the temperature data at 8:01 from the temperature data at 8:00 to obtain the temperature difference data $\Delta T$ that represents 8:01. Because the temperature data retrieving module 330 continuously retrieves the temperature data, the temperature difference data $\Delta T$ are continuously generated in step S415.

In step S420, the micro-controller 320 uses the temperature difference data $\Delta T$ to compute the Z score. In one embodiment, the Z score is illustrated as the function:

$$Z\_score = \frac{x - u}{\sigma},$$

where x is the current temperature difference data $\Delta T$, u is the average value of all the temperature difference data $\Delta T$ up to present, and $\sigma$ is the standard deviation of all the temperature difference data $\Delta T$ up to present.

In step S425, the micro-controller 320 sets the first discrete score to the temperature slope, such as obtained in step S410. Considering multiple adjacent time windows, the micro-controller 320 continuously computes the maximum temperature slope and the minimum temperature slope of every two paired time windows among multiple time windows. To clarify the description, $S_{max(i)}$ represents the ith maximum temperature slope (the slope obtained by the maximum window temperature values of the ith and (i+1)th time windows) and $S_{min(i)}$ represents the ith minimum temperature slope (the slope obtained by the minimum window temperature values of the ith and (i+1)th time windows).

In one embodiment, multiple continuous time windows include a first window, a second window, and a third window. The micro-controller 320 uses the maximum window temperature values and the minimum window temperature values of the first window and the second window to respectively compute the first maximum temperature slope $S_{max(1)}$ and the first minimum temperature slope $S_{min(1)}$, and uses the maximum window temperature values and the minimum window temperature value of the second window and the third window to respectively compute the second maximum temperature slope $S_{max(2)}$ and the second minimum temperature slope $S_{min(2)}$.

In one embodiment, the micro-controller 320 determines which slope condition the temperature slope belongs to based on the numerical size relationship of the first maximum temperature slope $S_{max(1)}$, the first minimum temperature slope $S_{min(1)}$, the second maximum temperature slope $S_{max(2)}$, and the second minimum temperature slope $S_{min(2)}$. The slope condition is illustrated in TABLE I.

TABLE I

| Determinations | Slope Condition |
| --- | --- |
| $S_{max(1)} < S_{max(2)}$ & $S_{min(1)} < S_{min(2)}$ | First Condition |
| $S_{max(1)} > S_{max(2)}$ & $S_{min(1)} < S_{min(2)}$ | Second Condition |
| $S_{max(1)} < S_{max(2)}$ & $S_{min(1)} > S_{min(2)}$ | Third Condition |
| $S_{max(1)} > S_{max(2)}$ & $S_{min(1)} > S_{min(2)}$ | Fourth Condition |

As shown in TABLE I, if the first maximum temperature slope $S_{max(1)}$ is less than the second maximum temperature slope $S_{max(2)}$ and the first minimum temperature slope $S_{min(1)}$ is less than the second minimum temperature slope $S_{min(2)}$, it indicates the temperature variation that the high temperature still increases and the low temperature also shows an inclining trend (i.e., the temperature increases entirely). In this case, the slope condition belongs to the first condition. If the first maximum temperature slope $S_{max(1)}$ is greater than the second maximum temperature slope $S_{max(2)}$ and the first minimum temperature slope $S_{min(1)}$ is less than the second minimum temperature slope $S_{min(2)}$, it indicates the temperature variation that the low temperature shows the inclining trend. In this case, the slope condition belongs to the second condition. If the first maximum temperature slope $S_{max(1)}$ is less than the second maximum temperature slope $S_{max(2)}$ and the first minimum temperature slope $S_{min(1)}$ is greater than the second minimum temperature slope $S_{min(2)}$, it indicates the temperature variation that the high temperature shows the inclining trend. In this case, the slope condition belongs to the third condition. If the first maximum temperature slope $S_{max(1)}$ is greater than the second maximum temperature slope $S_{max(2)}$ and the first minimum temperature slope $S_{min(1)}$ is greater than the second minimum temperature slope $S_{min(2)}$, it indicates the temperature variation that the high temperature and the low temperature decrease (i.e., the temperature decreases entirely). In this case, the slope condition belongs to the fourth condition.

In one embodiment, the micro-controller 320 sets the first discrete score to the temperature slope according to the obtained slope condition incorporated with the slope difference $S_{diff}$, as shown in TABLE II.

TABLE II

| Slope Condition | Determination Of The Slope Condition | First Discrete Score |
| --- | --- | --- |
| First Condition | $S_{diff} >$ Thr: abnormal on increasing high temperature | 3 |
| | $S_{diff} <$ Thr: working normally | 0 |
| Second Condition | $\|S_{diff}\| >$ Thr: battery working abnormally | 3 |
| | $\|S_{diff}\| <$ Thr: working normally | 0 |
| Third Condition | $S_{diff} > 1.5 \times$ Thr: battery working abnormally | 3 |
| | $S_{diff} < 1.5 \times$ Thr: working normally | 0 |
| Fourth Condition | (no condition): working normally | 0 |

In one embodiment, after computing the maximum temperature slope and the minimum temperature slope of two adjacent time windows (step S410), the micro-controller 320 computes the difference between the maximum temperature slope and the minimum temperature slope to obtain the slope difference between two time windows. The slope difference is illustrated as the function: $S_{diff} = S_{max(i)} - S_{min(i)}$. For example, the micro-controller 320 subtracts the minimum temperature slope $S_{min(1)}$ from the maximum temperature slope $S_{max(1)}$, and the difference is taken as the slope difference $S_{diff(1)}$.

Regarding each slope condition, the micro-controller 320 sets the value of the first discrete score based on the slope difference $S_{diff}$ and the fluctuating threshold Thr. As shown in TABLE II, when the slope difference $S_{diff}$ is greater than the fluctuating threshold Thr at the first condition, it represents that the inclining trend of the high temperature is at an abnormal state, and the first discrete score is set to be 3; on the contrary, when the slope difference $S_{diff}$ is less than the fluctuating threshold Thr, it represents that the inclining trend of the high temperature is at a normal state, and the first discrete score is set to be 0. When an absolute value of the slope difference $S_{diff}$ is greater than the fluctuating threshold Thr at the second condition, it represents that the rising range of the low temperature is enormous, and the first discrete score is set to be 3; on the contrary, the rising range of the low temperature is still acceptable, and the first discrete score is set to be 0. When the slope difference $S_{diff}$ is greater than times the fluctuating threshold (such as 1.5 times the fluctuating threshold) at the third condition, it represents that the rising range of the high temperature is enormous, and the first discrete score is set to be 3; on the contrary, the rising range of the high temperature is still acceptable, and the first discrete score is set to be 0. At the fourth condition, both the high temperature and the low temperature show a declining trend, that is, the temperature does not increase entirely, so the first discrete score is set to be 0.

In one embodiment, the fluctuating threshold is 1.25, but it is not limited to the value.

In step S425, the micro-controller 320 sets the second discrete score to the maximum temperature obtained in step S410. The setting conditions are shown in TABLE III.

TABLE III

| Parameter | Setting Condition | Second Discrete Score |
|---|---|---|
| maximum temperature (per minute) maxT | maxT ≤ 40° C. | 0 |
| | maxT > 40° C. & |current| > 1 | 1 |
| | maxT > 40° C. & |current| ≤ 1 | 2 |

In one embodiment, the micro-controller 320 specifies the maximum temperature maxT every minute and sets the corresponding second discrete score. In one embodiment, the micro-controller 320 determines whether the maximum temperature maxT reaches the abnormal critical point, e.g., 40° C., but it is not limited to the value.

As shown in TABLE III, when the maximum temperature maxT is less than or equal to 40° C., the micro-controller 320 determines that the battery racks 400 work normally and sets the second discrete score to be 0. When the maximum temperature maxT is greater than 40° C. and the current (absolute value) is greater than 1, it represents that the battery racks 400 are in the working state. Accordingly, the micro-controller 320 determines that the high temperature may induce a low risk and sets the second discrete score to be 1. When the maximum temperature maxT is greater than 40° C. and the current (absolute value) is less than or equal to 1, it represents that the battery racks 400 are at idle state currently. Because the temperature of the battery racks 400 in the idle state should present a lower value than they work in normal situations (e.g., lower than 40° C.), the micro-controller 320 determines that the high temperature of the battery racks 400 may induce a risk, so the second discrete score is set to be 2.

In step S425, the micro-controller 320 sets the third discrete score to the minimum temperature obtained in step S410. The setting conditions are shown in TABLE IV.

TABLE IV

| Parameter | Setting Condition | Third Discrete Score |
|---|---|---|
| Minimum Temperature (per minute) minT | minT > 10° C. | 0 |
| | minT < 10° C. & |current| < 1 | 1 |
| | minT < 10° C. & |current| ≥ 1 | 2 |

In one embodiment, the micro-controller 320 specifies the minimum temperature minT every minute and sets the corresponding third discrete score. In one embodiment, the micro-controller 320 determines whether the minimum temperature minT reaches the abnormal critical point, e.g., 10° C., but it is not limited to the value.

As shown in TABLE IV, when the minimum temperature minT is greater than 10° C., the micro-controller 320 determines that the battery racks 400 work normally and sets the third discrete score to be 0. When the minimum temperature minT is less than 10° C. and the current (absolute value) is less than 1, it represents that the battery racks 400 are in the idle state. Accordingly, the micro-controller 320 determines that the low temperature may induce a low risk and sets the third discrete score to be 1. When the minimum temperature minT is less than 10° C. and the current (absolute value) is greater than or equal to 1, it represents that the battery racks 400 are in the working state. Because the temperature of the battery racks 400 in the working state should present a higher value than they are idle (e.g., higher than 10° C.), the micro-controller 320 determines that the low temperature of the battery racks 400 may be abnormal and sets the third discrete score to be 2.

In step S425, the micro-controller 320 sets the fourth discrete score to the Z score obtained in step S420. The setting conditions are shown in TABLE V.

TABLE V

| Parameter | Setting Condition | Fourth Discrete Score |
|---|---|---|
| Z score | Z < 5 | 0 |
| | 5 ≤ Z ≤ 10 | 1 |
| | Z > 10 | 2 |

In one embodiment, two critical points of the Z score are 5 and 10, but they are not limited to the values.

As shown in TABLE V, when the Z score is less than 5, it represents that the temperature variation of the battery racks 400 remains in the acceptable range, and the micro-controller 320 sets the fourth discrete score to be 0. When the Z score is between 5 and 10, it represents that the temperature variation of the battery racks 400 fluctuates with larger values and may induce a risk. Therefore, the micro-controller 320 sets the fourth discrete score to be 1. When the Z score is greater than 10, it represents that the temperature variations of the battery racks 400 fluctuate much more than normal conditions and may induce a high risk. Therefore, the micro-controller 320 sets the fourth discrete score to be 2.

In step S430, the micro-controller 320 adds the first discrete score, the second discrete score, the third discrete score, and the fourth discrete score to obtain the sum of the four parameters, and the sum is taken as the grading value.

In step S435, when the grading value is greater than or equal to the abnormal threshold, the micro-controller 320 generates the alarm message.

In one embodiment, the abnormal threshold is a numeral value 6. For example, when the first discrete score is 3 (i.e., abnormal on increasing high temperature at first condition), the second discrete score is 0 (i.e., the maximum temperature per minute is not over 40° C.), the third discrete score is 0 (i.e., the minimum temperature per minute is greater than 10° C.), and the fourth discrete score is 1 (i.e., the temperature fluctuation may induce risk), the sum of the four discrete scores is 4, that is, the grading value is 4. Because the numerical value 4 does not exceed the abnormal threshold, i.e., the numerical value 6, the micro-controller 320 determines that there is no abnormal state in the battery racks 400.

When the first discrete score is 3 (i.e., the rising range of the high temperature is enormous in the third condition), the second discrete score is 2 (i.e., the maximum temperature per minute is over 40° C. and the battery racks 400 are idle), the third discrete score is 1 (i.e., the minimum temperature per minute is less than 10° C. and the battery racks 400 are idle), and the fourth discrete score is 0 (i.e., the temperature fluctuation is still acceptable), the sum of the four discrete scores is 6, that is, the grading value is 6. Because the numerical value 6 is equal to the abnormal threshold 6, the micro-controller 320 determines that the battery racks 400 may work at an abnormal state.

Because the alarm message indicates the position corresponding to the maximum temperature or the minimum temperature of the temperature feature data, where the position infers which battery rack 400 works at the abnormal state, the user may get the information on which battery rack 400 works at the abnormal state through the alarm message. According to the embodiments above, the user may find the corresponding battery rack 400 based on the abnormal maximum temperature maxT, so countermeasures against the abnormal conditions may be provided to prevent disasters.

In one embodiment, the failure detection method for the battery racks by detecting the temperature is suitable for one or more battery racks in the present disclosure, and it is not limited to the number of the battery racks 400 shown in FIG. 3. For example, the scenario in FIG. 3 may provide multiple battery racks 400, and the battery racks failure detection system 20 includes multiple temperature data retrieving modules 330. Each temperature data retrieving module 330 is disposed on one battery rack 400 and configured to sense the temperature data of the battery rack 400 where the temperature data retrieving module 330 is disposed. The micro-controller 320 is coupled to all the temperature data retrieving modules 330 to perform the steps of detecting the temperature of the battery racks for the abnormal detection.

Figure 5:
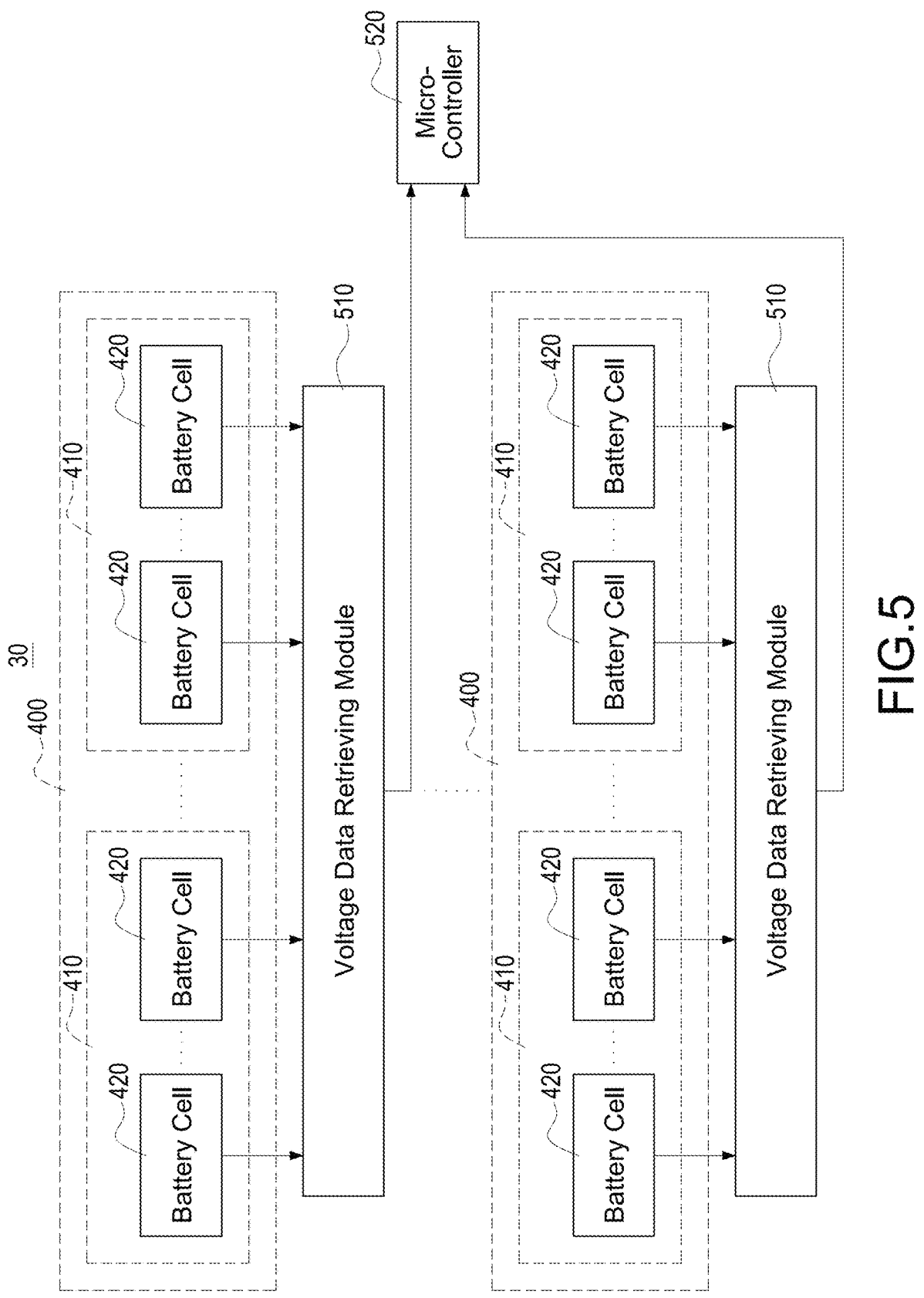
FIG. 5 is a block diagram illustrating a failure detection system for battery racks by detecting voltage to monitor anomaly states of the battery racks in accordance with another embodiment of the present disclosure.

FIG. 5 is a block diagram illustrating a failure detection system for battery racks by detecting voltage to monitor anomaly states of the battery racks in accordance with another embodiment of the present disclosure.

In the embodiment, as shown in FIG. 5, the multiple battery racks 400 are applied in the scenario. Each battery rack 400 includes multiple battery modules 410, and each battery module 410 includes multiple battery cells 420.

The battery racks failure detection system 30 includes multiple voltage data retrieving modules 510 and the micro-controller 520. Every voltage data retrieving module 510 is coupled to the micro-controller 520. In the embodiment, every voltage data retrieving module 510 is disposed on a corresponding one of the battery racks 400 and configured to sense the voltage data of every battery cell 420 of each battery module 410.

In one embodiment, the battery racks failure detection system 30 is configured to perform the failure detection method for battery racks 400 by detecting voltage. For example, every voltage data retrieving module 510 sends the voltage data to the micro-controller 520, and the micro-controller 520 performs the failure detection method provided in FIG. 2.

Figure 6:
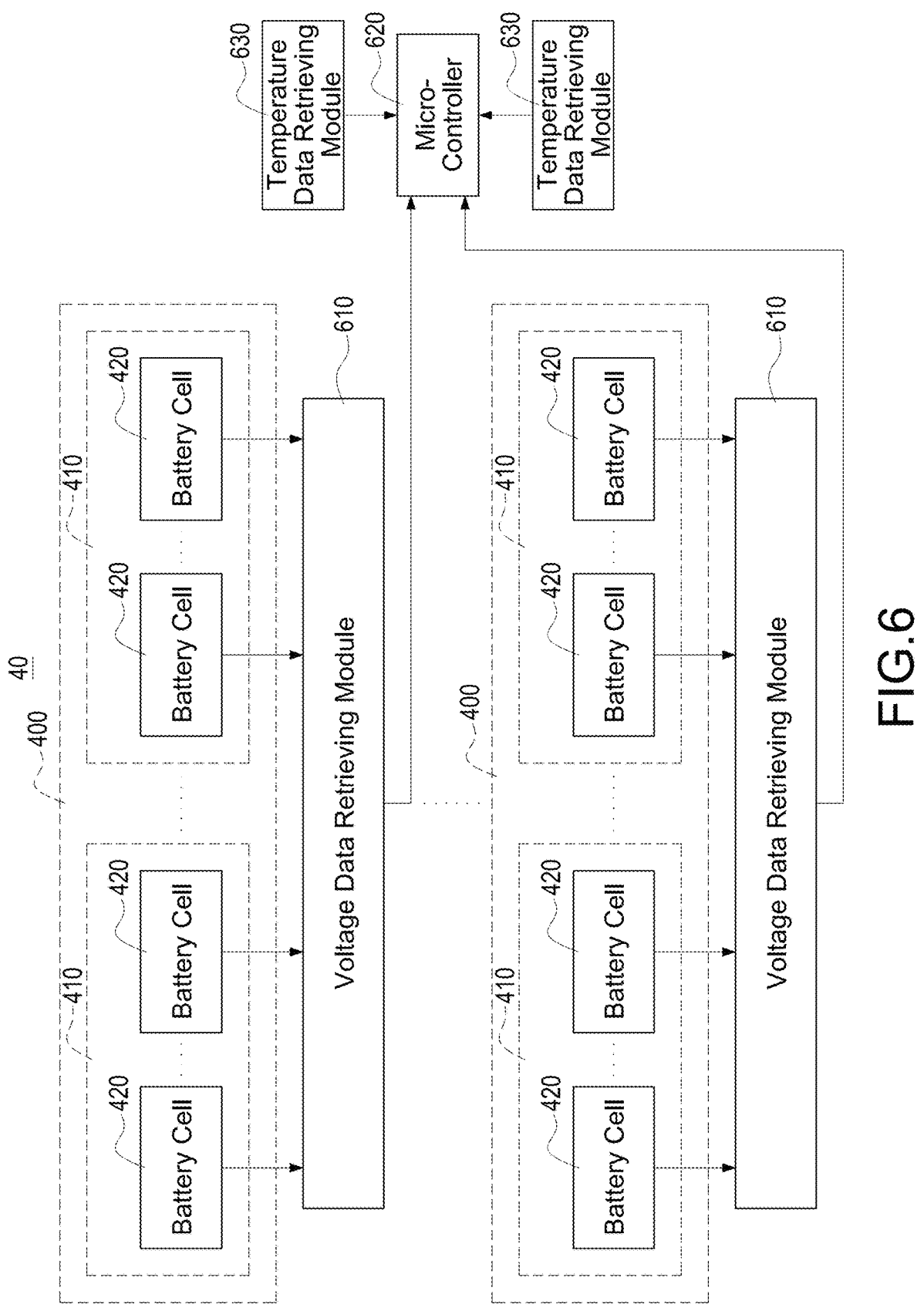
FIG. 6 is a block diagram illustrating a failure detection system for battery racks by detecting voltage and temperature at the same time to monitor anomaly states of the battery racks in accordance with an embodiment of the present disclosure.

FIG. 6 is a block diagram illustrating a failure detection system for battery racks by detecting voltage and temperature at the same time to monitor anomaly states of the battery racks in accordance with another embodiment of the present disclosure.

In the embodiment, as shown in FIG. 6, the scenario considers multiple battery racks 400. Each battery rack 400 includes multiple battery modules 410, and each battery module 410 includes multiple battery cells 420.

The battery racks failure detection system 40 includes multiple voltage data retrieving modules 610, a micro-controller 620, and multiple temperature data retrieving modules 630. Every voltage data retrieving module 610 and every temperature data retrieving module 630 are respectively coupled to the micro-controller 620.

In the embodiment, every voltage data retrieving module 610 is disposed on each corresponding one of the battery racks 400 and configured to sense the voltage data of each battery cell 620 of each battery module 610.

In the embodiment, every temperature data retrieving module 630 is disposed on each corresponding one of the battery racks 400 and configured to sense the temperature data of each battery rack 400.

In one embodiment, the battery racks failure detection system 40 is configured to detect the voltage and temperature at the same time to perform the failure detection method for the battery racks 400. For example, every voltage data retrieving module 610 sends the voltage data to the micro-controller 620, every temperature data retrieving module 630 sends the temperature data to the micro-controller 620, and the micro-controller 620 performs the failure detection method provided in FIG. 2 and FIG. 4.

In one embodiment, the micro-controller may be, but not limited to, a Digital Signal Processor (DSP), an Application Specific Integrated Circuit (ASIC), a Central Processing Unit (CPU), a System on Chip (SoC), a Field Programmable Gate Array (FPGA), a Network Processor IC, or the combination of the components above.

In one embodiment, the battery racks may be the energy storage system, such as the battery station for vehicle equipment, the energy storage system for green energy, and the like. The battery racks failure detection system and the failure detection method may be provided to detect the battery racks or the energy storage system.

Accordingly, the failure detection method and failure detection system for the battery racks by detecting the voltage and the temperature considering the detection of the voltage and the temperature may not only detect the abnormal states in battery racks in advance but also enhance the precision of anomaly detection. Furthermore, the corresponding measures may also be taken in response to the position of the abnormal voltage and/or temperature to find the corresponding battery racks, so that disasters may be prevented.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A failure detection method for battery racks, performed by a failure detection system for battery racks comprising a voltage data retrieving module and a micro-controller, wherein the battery racks comprise multiple battery modules, and the failure detection method comprises:

step (a) sensing a voltage data of battery cells of the multiple battery modules by the voltage data retrieving module, and continuously computing a voltage difference data of the voltage data in a computation frequency by the micro-controller;

step (b) using the voltage difference data of the battery racks up to present to compute a standard deviation by the micro-controller;

step (c) when determining that the standard deviation is greater than a preliminary threshold, respectively obtaining a first voltage trend according to the voltage difference data of a first period and a second voltage trend according to the voltage difference data of a second period, wherein the second period is greater than the first period;

step (d) computing, by the micro-controller, an intersection of the first voltage trend and the second voltage trend to obtain a voltage trend state;

step (e) computing, by the micro-controller, a voltage slope according to the voltage difference data of the second period; and step (f) when determining that the voltage trend state is at a potentially abnormal state and the voltage slope is greater than a slope threshold, generating an alarm message by the micro-controller, wherein the alarm message indicates that a position of the battery cells being at an overvoltage state corresponding to the voltage difference data when the standard deviation is greater than the preliminary threshold.

2. The failure detection method of claim 1, wherein the step (c) further comprises:

(c1) computing a difference of the voltage difference data between each of the first periods to obtain multiple first trend data;

(c2) computing a first quantity that the multiple first trend data are greater than the standard deviation and a second quantity that the multiple first trend data are less than or equal to the standard deviation;

(c3) determining the first voltage trend according to the first quantity and the second quantity;

(c4) computing a difference of the voltage difference data between each of the second periods to obtain multiple second trend data;

(c5) computing a third quantity that the multiple second trend data are greater than the standard deviation and a fourth quantity that the multiple second trend data are less than or equal to the standard deviation; and (c6) determining the second voltage trend according to the third quantity and the fourth quantity.

3. The failure detection method of claim 2, wherein the step (c3) further comprises: determining, by the micro-controller, that the first voltage trend is at a positive trend when the first quantity is greater than the second quantity, and the step (c6) further comprises: determining, by the micro-controller, that the second voltage trend is at the positive trend when the third quantity is greater than the fourth quantity.

4. The failure detection method of claim 3, wherein the step (d) comprises: when the intersection of the first voltage trend and the second voltage trend is the positive trend, indicating, by the micro-controller, that the voltage trend state is at the potentially abnormal state.

5. The failure detection method of claim 1, further comprising computing, by the micro-controller, the difference of the voltage of each battery cell in each minute to obtain the voltage difference data.

6. The failure detection method of claim 1, wherein the battery racks failure detection system comprises a temperature data retrieving module being coupled to the micro-controller, and the failure detection method further comprises:

step (g) sensing a temperature data of the battery racks by the temperature data retrieving module, and using the temperature data, by the micro-controller, to compute a temperature slope, a maximum temperature, and a minimum temperature of the multiple temperature feature data;

step (h) continuously computing, by the micro-controller, a temperature difference data of the temperature data in the computation frequency, and using the temperature difference data to compute a Z score;

step (i) setting, by the micro-controller, a first discrete score to the temperature slope, a second discrete score to the maximum temperature, a third discrete score to the minimum temperature, and a fourth discrete score to the Z score;

step (j) adding up, by the micro-controller, the first discrete score, the second discrete score, the third discrete score, and the fourth discrete score to obtain a grading value; and step (k) evaluating, by the micro-controller, whether the battery racks are at an abnormal state according to the grading value, and generating an alarm message when evaluating that the battery racks are at the abnormal state, wherein the alarm message indicates that the position of the maximum temperature or the minimum temperature represents the battery racks being abnormal.

7. The failure detection method of claim 6, wherein the temperature slope comprises a maximum temperature slope and a minimum temperature slope, and step of computing the temperature slope in the step (g) further comprises:

step (g1) obtaining, by the micro-controller, a maximum window temperature value and a minimum window temperature value of the temperature data in a time window;

step (g2) computing the maximum temperature slope between the maximum window temperature values of two adjacent time windows; and step (g3) computing the minimum temperature slope between the minimum window temperature values of two adjacent time windows, wherein the two adjacent time windows partially overlap.

8. The failure detection method of claim 7, wherein after computing the maximum temperature slope and the minimum temperature slope of the two adjacent time windows, comprises a step (g4): computing, by the micro-controller, the difference between the maximum temperature slope and the minimum temperature slope to obtain a slope difference of the two adjacent time windows.

9. The failure detection method of claim 8, wherein the step (j) comprises computing a first maximum temperature slope, a first minimum temperature slope, a second maximum temperature slope, and a second minimum temperature slope by two adjacent time windows to one set from three adjacent time windows, and setting the first discrete score by multiple slope conditions, wherein the multiple slope conditions comprise that:

the first maximum temperature slope is less than the second maximum temperature slope, the first minimum temperature slope is less than the second minimum temperature slope, and the slope difference is greater than a fluctuating threshold;

the first maximum temperature slope is greater than the second maximum temperature slope, the first minimum temperature slope is less than the second minimum temperature slope, and an absolute value of the slope difference is greater than the fluctuating threshold;

the first maximum temperature slope is less than the second maximum temperature slope, the first minimum temperature slope is greater than the second minimum temperature slope, and the slope difference is greater than times of the fluctuating threshold; and the first maximum temperature slope is greater than the second maximum temperature slope, and the first minimum temperature slope is greater than the second minimum temperature slope.

10. The failure detection method of claim 9, wherein the step (h) comprises:

continuously computing the difference of the temperature of adjacent time in the computation frequency of each minute to obtain the temperature difference data;

continuously computing an average value of the temperature difference data and the standard deviation up to present; and using the average value and the standard deviation to compute the Z score of a current temperature, wherein the Z score is $$\frac{x-u}{\sigma},$$

x is the current temperature difference data, u is the average value of all the temperature difference data up to present, and σ is the standard deviation of all the temperature difference data up to present.

11. The failure detection method of claim 10, wherein the step ( ) further comprises:

continuously detecting the maximum temperature of the temperature data in each minute, and setting the second discrete score according to the maximum temperature and a charge-discharge state of current;

continuously detecting the minimum temperature of the temperature data in each minute, and setting the third discrete score according to the minimum temperature and the charge-discharge state of the current; and setting the fourth discrete score according to a range of the Z score.

12. A failure detection method for battery racks, performed by a battery racks failure detection system comprising a temperature data retrieving module and a micro-controller, wherein the battery racks comprise multiple battery modules, and the failure detection method comprises:

step (a) sensing a temperature data of the battery racks by the temperature data retrieving module, and using the temperature data, by the micro-controller, to compute a temperature slope, a maximum temperature, and a minimum temperature of multiple temperature feature data;

step (b) continuously computing, by the micro-controller, a temperature difference data of the temperature data in a computation frequency, and using the temperature difference data to compute a Z score;

step (c) setting, by the micro-controller, a first discrete score to the temperature slope, a second discrete score to the maximum temperature, a third discrete score to the minimum temperature, and a fourth discrete score to the Z score;

step (d) adding up, by the micro-controller, the first discrete score, the second discrete score, the third discrete score, and the fourth discrete score to obtain a grading value; and step (e) evaluating, by the micro-controller, whether the battery racks are at an abnormal state according to the grading value, and generating an alarm message when evaluating that the battery racks are at the abnormal state, wherein the alarm message indicates that a position of the maximum temperature or the minimum temperature represents the battery racks being abnormal.

13. The failure detection method of claim 12, wherein the temperature slope comprises a maximum temperature slope and a minimum temperature slope, and step of computing the temperature slope in the step (a) comprises:

step (a1) obtaining, by the micro-controller, a maximum window temperature value and a minimum window temperature value of the temperature data in a time window;

step (a2) computing the maximum temperature slope between the maximum window temperature values of two adjacent time windows; and step (a3) computing the minimum temperature slope between the minimum window temperature values of two adjacent time windows, wherein the two adjacent time windows partially overlap.

14. The failure detection method of claim 13, wherein after computing the maximum temperature slope and the minimum temperature slope of the two adjacent time windows, further comprises a step (a4): computing, by the micro-controller, the difference between the maximum temperature slope and the minimum temperature slope to obtain a slope difference of the two adjacent time windows.

15. The failure detection method of claim 14, wherein the step (c) computing a first maximum temperature slope, a first minimum temperature slope, a second maximum temperature slope, and a second minimum temperature slope by two adjacent time windows to one set from three adjacent time windows, and setting the first discrete score by multiple slope conditions, wherein the multiple slope conditions comprise that:

the first maximum temperature slope is less than the second maximum temperature slope, the first minimum temperature slope is less than the second minimum temperature slope, and the slope difference is greater than a fluctuating threshold;

the first maximum temperature slope is greater than the second maximum temperature slope, the first minimum temperature slope is less than the second minimum temperature slope, and an absolute value of the slope difference is greater than the fluctuating threshold;

the first maximum temperature slope is less than the second maximum temperature slope, the first minimum temperature slope is greater than the second minimum temperature slope, and the slope difference is greater than times of the fluctuating threshold; and the first maximum temperature slope is greater than the second maximum temperature slope, and the first minimum temperature slope is greater than the second minimum temperature slope.

16. The failure detection method of claim 15, wherein the step (b) comprises:

continuously computing the difference of the temperature of adjacent time in the computation frequency of each minute to obtain the temperature difference data;

continuously computing an average value of the temperature difference data and the standard deviation up to present; and using the average value and the standard deviation to compute the Z score of a current temperature, wherein the Z score is $$\frac{x-u}{\sigma},$$

x is the current temperature difference data, u is the average value of all the temperature difference data up to present, and a is the standard deviation of all the temperature difference data up to present.

17. The failure detection method of claim 16, wherein the step (c) further comprises:

continuously detecting the maximum temperature of the temperature data in each minute, and setting the second discrete score according to the maximum temperature and a charge-discharge state of current;

continuously detecting the minimum temperature of the temperature data in each minute, and setting the third discrete score according to the minimum temperature and the charge-discharge state of the current; and setting the fourth discrete score according to a range of the Z score.

18. A failure detection system for multiple battery racks, wherein each of the multiple battery racks comprises multiple battery modules, and the failure detection system comprises:

multiple voltage data retrieving modules, wherein each of the multiple voltage data retrieving modules is configured to sense a voltage data of multiple battery cells of each of the multiple battery modules of the battery rack that the voltage data retrieving module locates;

multiple temperature data retrieving modules, wherein each of the multiple temperature data retrieving modules is configured to sense a temperature data of the battery racks that the temperature data retrieving module locates; and a micro-controller coupled to each of the multiple voltage data retrieving modules and each of the multiple temperature data retrieving modules, and configured to perform the failure detection method of claim 6.

\* \* \* \* \*